(12) United States Patent
Jung

(10) Patent No.: US 8,105,913 B2
(45) Date of Patent: Jan. 31, 2012

(54) METHOD OF FABRICATING A CAPACITOR OF A SEMICONDUCTOR DEVICE

(75) Inventor: Yong Soon Jung, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 158 days.

(21) Appl. No.: 12/340,342

(22) Filed: Dec. 19, 2008

(65) Prior Publication Data

US 2009/0221126 A1    Sep. 3, 2009

(30) Foreign Application Priority Data

Mar. 3, 2008    (KR) .......................... 10-2008-0019626

(51) Int. Cl.
*H01L 21/20*    (2006.01)
(52) U.S. Cl. ................. 438/386; 438/387; 257/E21.008
(58) Field of Classification Search .................. 438/386, 438/387
See application file for complete search history.

(56) References Cited

U.S. PATENT DOCUMENTS

| 6,235,603 | B1 * | 5/2001 | Melnick et al. ............... 438/393 |
| 2004/0129961 | A1 * | 7/2004 | Paz de Araujo et al. ...... 257/295 |
| 2006/0065981 | A1 | 3/2006 | Egusa .......................... 257/774 |

FOREIGN PATENT DOCUMENTS

| JP | 2001-284354 | 10/2001 |
| JP | 2005-038888 | 2/2005 |
| KR | 10-2007-0067404 | 6/2007 |

* cited by examiner

*Primary Examiner* — Alexander Ghyka
(74) *Attorney, Agent, or Firm* — Marshall, Gerstein & Borun LLP

(57) ABSTRACT

Disclosed herein is a method of fabricating a capacitor of a semiconductor device that includes sequentially forming an interlayer insulating film defining a contact plug, a lower electrode oxide film, and a hard mask film over a semiconductor substrate; etching the hard mask film with a mask comprising a dummy pattern and a cell pattern to form a hard mask pattern wherein a first trench is formed in a dummy pattern region and a second trench is formed in a cell pattern region; forming a capping film that buries the first trench; and etching the lower electrode oxide film with the capping film and the hard mask pattern as a mask to form a lower electrode trench that exposes the contact plug.

19 Claims, 7 Drawing Sheets

METHOD OF FABRICATING A CAPACITOR OF A SEMICONDUCTOR DEVICE

CROSS-REFERENCE TO RELATED APPLICATION

Priority to Korean patent application number 10-2008-0019626 filed Mar. 3, 2008, the entire disclosure of which is incorporated by reference, is claimed.

BACKGROUND OF THE INVENTION

The invention relates generally to a method of fabricating a capacitor of a semiconductor device and, more specifically, to a method of improving a bunker defect and a short circuit phenomenon between a bit line and a lower electrode oxide pattern, which can be generated when a cylinder type capacitor having a design rule of less than 50 nm is formed.

As the demand for semiconductor memory devices increases, various techniques for obtaining a capacitor of high capacity have been suggested. The capacitor comprises a dielectric film formed between a lower electrode and an upper electrode. The capacity of the capacitor is proportional to a dielectric constant of the dielectric film and a surface area of the electrode surface, and inversely proportional to a gap between the electrodes, i.e., the thickness of the dielectric film.

In order to obtain a capacitor of high capacity, use of a dielectric film having a large dielectric constant and enlargement of the electrode surface are required. Also, it is necessary to reduce the distance between the electrodes.

However, since there is a limitation in reduction of the distance between the electrodes, i.e., the thickness of the dielectric film, a dielectric film having a large dielectric constant is used or the electrode surface is enlarged to form a capacitor of high capacity.

As shown in FIG. 1, a concave type electrode using an inner sidewall has been widely used as a lower electrode structure of the capacitor. However, as shown in FIG. 2, a cylinder type electrode using an outer sidewall as well as an inner sidewall is useful to maximize the electrode surface.

FIGS. 1 and 2 show a semiconductor substrate 1, an interlayer insulating film 2, a bit line 3, a contact plug 4, an etching barrier film 5, a lower electrode oxide film 6, a concave type lower electrode 7a, and a cylinder type lower electrode 7b.

As the size of a dummy pattern increases when the lower electrode oxide film 6 is etched, the lower electrode oxide film 6 is over-etched rather than an inner cell pattern, so that the bit line 3 of the lower end portion and a pattern of the lower electrode oxide film 6 are interconnected to cause a short circuit phenomenon. Although the dummy pattern does not serve as a transistor, the dummy pattern improves a process margin in an exposing process.

When forming the cylinder type capacitor, a wet etching process, which is called a dip-out process, is performed to remove the lower electrode oxide film 6 (see FIG. 1) used as a frame after the lower electrode 7b is formed.

During the wet etching process, an etching solution penetrates into the lower electrode material, illustratively a TiN film, thereby causing a bunker defect where the etching solution penetrates into the etching barrier film 5, including a nitride film, and the interlayer insulating film 2, including an oxide film, which are located under the capacitor. As a result, the device reliability and the manufacturing yield are degraded.

The short circuit phenomenon and the bunker defect are generated because the size of a hole of the dummy pattern, which is the outer pattern of the layout, is enlarged when the lower electrode oxide film 6 is etched to form a pattern.

However, when the size of the dummy pattern is reduced so as to be identical with that of the cell pattern for constituting the layout, a depth of focus margin in the exposing process is reduced to less than 0.03 μm, so that there is no mass product margin. Also, the size of the hole of the cell pattern, which serves as a transistor, is affected to cause a phenomenon such that a pattern of the lower electrode oxide film 6 is not defined.

BRIEF SUMMARY OF THE INVENTION

Various embodiments of the invention are directed at providing a method of removing a dummy pattern that can cause a bunker defect and a short circuit phenomenon between a bit line and a lower electrode oxide film pattern that are generated in a subsequent process without reducing the size of the dummy pattern, which does not serve as a transistor, to improve a process margin in an exposing process.

According to an embodiment of the invention, a method of fabricating a capacitor of a semiconductor device includes: sequentially forming an interlayer insulating film defining a contact plug, a lower electrode oxide film, and a hard mask film over a semiconductor substrate; etching the hard mask film with a mask including a dummy pattern and a cell pattern to form a hard mask pattern where a first trench is formed in a dummy pattern region and a second trench is formed in a cell pattern region; forming a capping film that buries the first trench; and etching the lower electrode oxide film with the capping film and the hard mask pattern as a mask to form a lower electrode trench that exposes the contact plug.

The first trench preferably has a first hole and the second trench has a second hole, and a diameter of the first hole preferably is larger than that of the second hole.

An upper oxide film preferably is formed over the hard mask pattern, and the oxide film preferably exposes the first hole of the first trench and covers the second hole of the second trench.

The upper oxide film preferably comprises plasma enhancement-tetraethyloxysilicate (PE-TEOS).

The method preferably further comprises forming an etching barrier film over the contact plug and a floating nitride film over the lower electrode oxide film.

The capping film preferably is formed over the upper oxide film.

The method preferably further comprises blanket-etching the capping film and exposing the hard mask pattern.

The oxide film preferably is deposited to a thickness in a range of about 10 nm to about 1000 nm.

The diameter of the first hole of the first trench preferably in a range of about 10 nm to about 100 nm.

The lower electrode oxide film preferably comprises one selected from the group consisting of phosphosilicate glass (PSG) oxide films, PE-TEOS oxide films, and combinations thereof.

The floating nitride film preferably comprises a low pressure nitride film formed by a chemical vapor deposition (CVD) method.

The hard mask film preferably comprises one selected from the group consisting of amorphous carbon layers, multifunctional hard mask films, and antireflection films.

BRIEF DESCRIPTION OF THE DRAWINGS

FIG. 1 shows a concave type capacitor lower electrode, and FIG. 2 shows a cylinder type capacitor lower electrode.

DESCRIPTION OF SPECIFIC EMBODIMENTS

FIGS. 3a to 3i are cross-sectional diagrams illustrating a method of fabricating a capacitor of a semiconductor device according to an embodiment of the invention.

Figure 1:
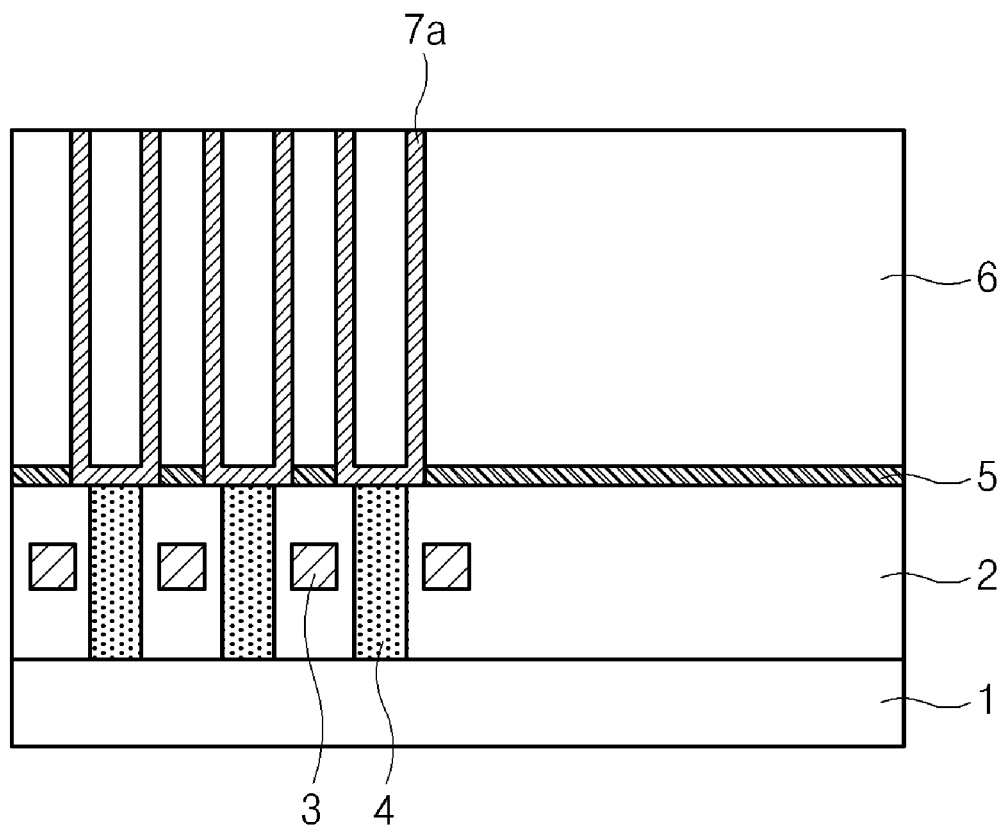
FIGS. 1 and 2 are cross-sectional diagrams illustrating a conventional capacitor lower electrode.
Figure 2:
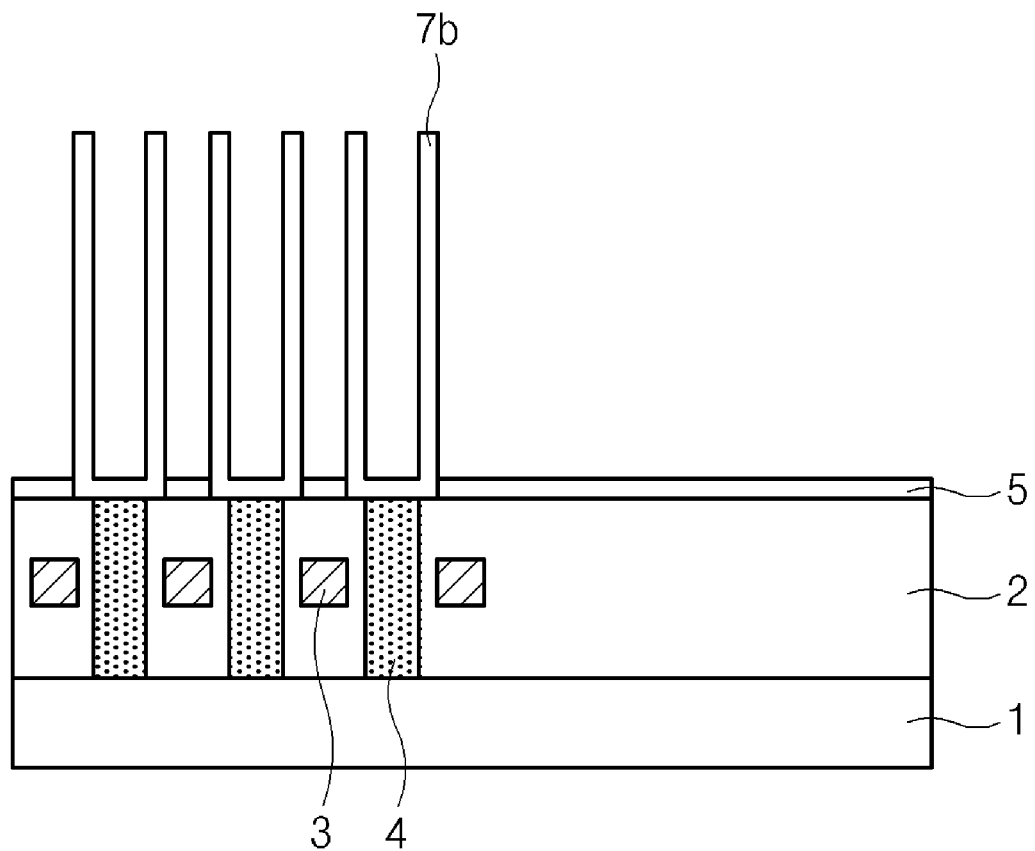
Figure 3A:
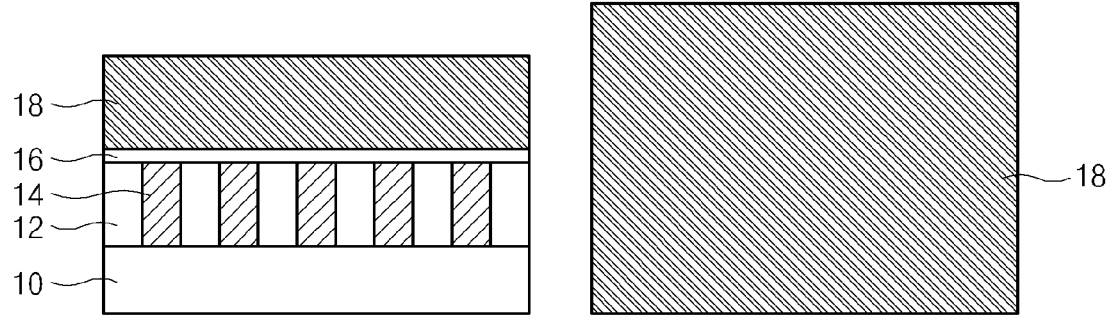
FIGS. 3a to 3i are cross-sectional diagrams illustrating a method of fabricating a capacitor of a semiconductor device according to an embodiment of the invention.

Referring to FIG. 3a, an interlayer insulating film 12 including a storage node contact plug 14 is formed over an underlying semiconductor substrate 10. An etching barrier film 16 comprising a nitride film and a lower electrode oxide film 18, which determines a height of a lower electrode, are formed over the interlayer insulating film 12. The lower electrode oxide film 18 is preferably a phosphosilicate glass (PSG) oxide film, a PE-TEOS oxide film, or a combination thereof.

Figure 3B:
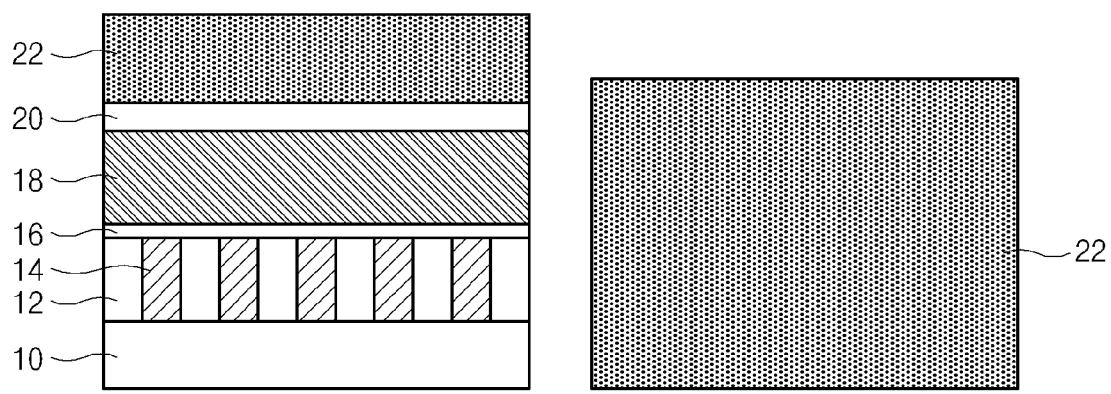

Referring to FIG. 3b, a floating nitride film 20 and a hard mask film 22 are formed over the lower electrode oxide film 18. The floating nitride film 20 is preferably a low pressure nitride film formed by a chemical vapor deposition (CVD) method. The hard mask film 22 is preferably an amorphous carbon layer, a multi-functional hard mask film, an antireflection film, or a combination thereof.

Figure 3C:
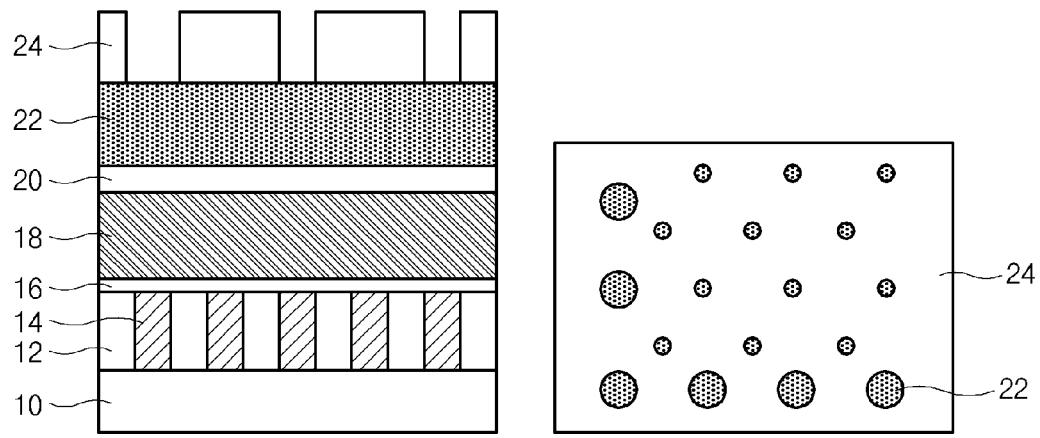

Referring to FIG. 3c, a photoresist pattern 24 for etching the lower electrode oxide film 18 is formed over the hard mask film 22. The photoresist pattern 24 is obtained as follows. First, a photoresist composition is coated over the hard mask film 22 to form a photoresist film. An exposing and developing process is performed on the photoresist film with an exposure mask using a light source such as KrF, ArF, $F_2$ or E-beam, thereby obtaining the photoresist pattern 24. The photoresist pattern 24 is formed in consideration of a depth of focus so that a hole size of a dummy pattern (i.e. the outer pattern), which does not expose a contact plug, is larger than that of a cell pattern, which exposes a contact plug for formation of an electrode.

Figure 3D:
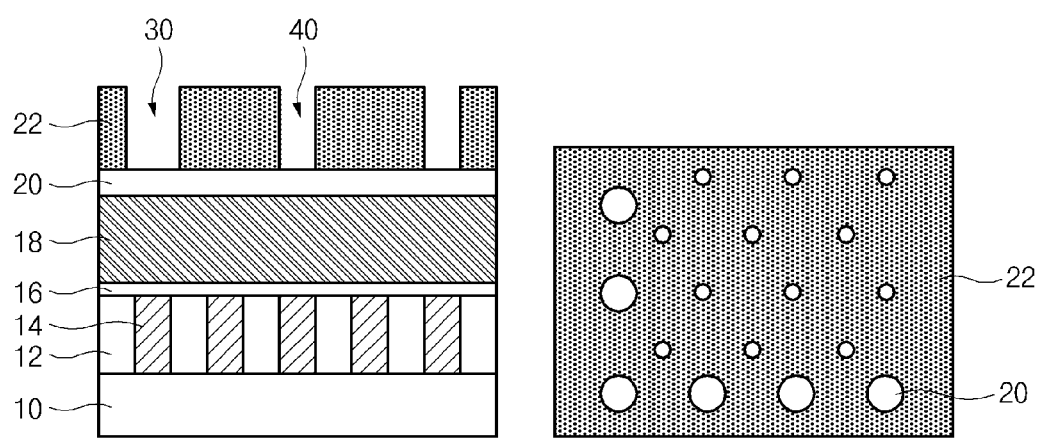

Referring to FIG. 3d, the hard mask film 22 is etched with the photoresist pattern 24 as an etching mask, thereby forming a first trench 30 in a lower portion of the dummy pattern and a second trench 40 in a lower portion of the cell pattern. As a result, a pattern of the hard mask film 22 is formed which includes the first trench 30 and the second trench 40.

Figure 3E:
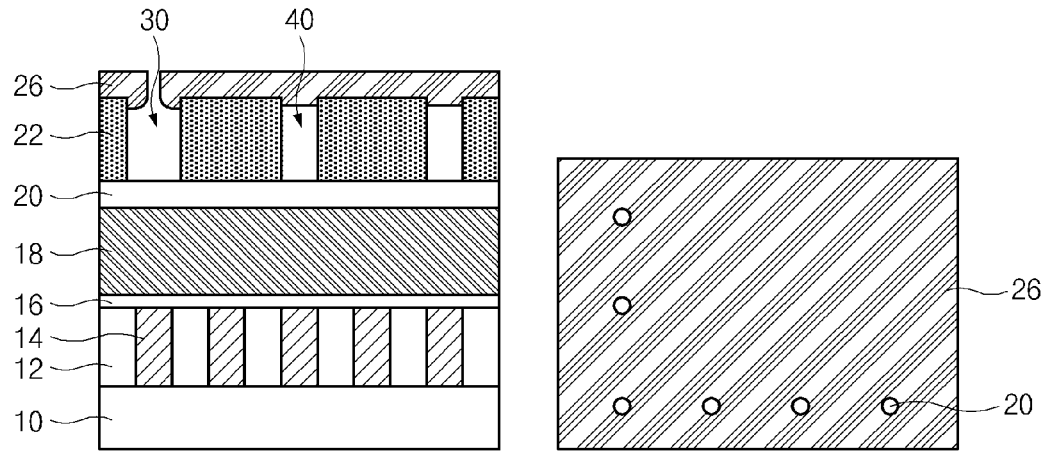

Referring to FIG. 3e, a PE-TEOS upper oxide film 26 having a bad step coverage is formed, preferably to a thickness in a range of about 10 nm to about 1000 nm, over the hard mask film 22. A hole, preferably having a diameter in a range of about 10 nm to about 100 nm is formed in the first trench 30 so as to expose the first trench 30 and to cover the second trench 40.

Figure 3F:
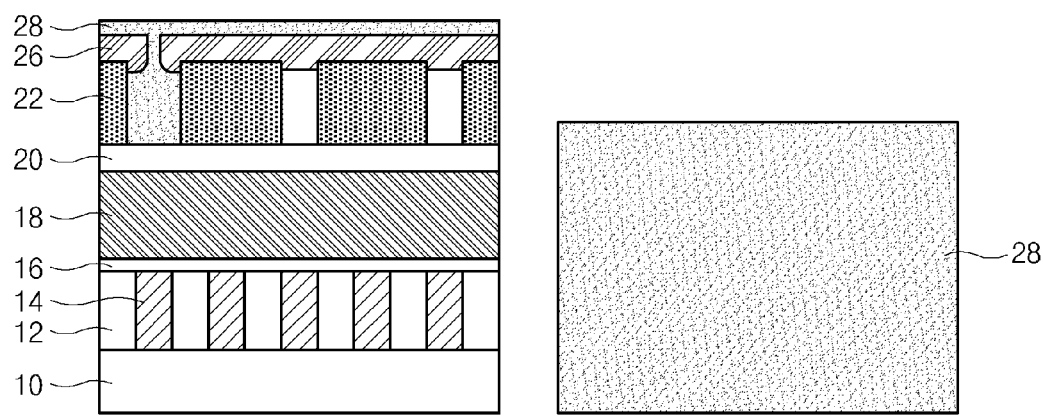

Referring to FIG. 3f, an antireflection film material having a good step coverage is coated over the PE-TEOS upper oxide film 26 for burying the first trench 30, thereby forming a capping film 28.

Figure 3G:
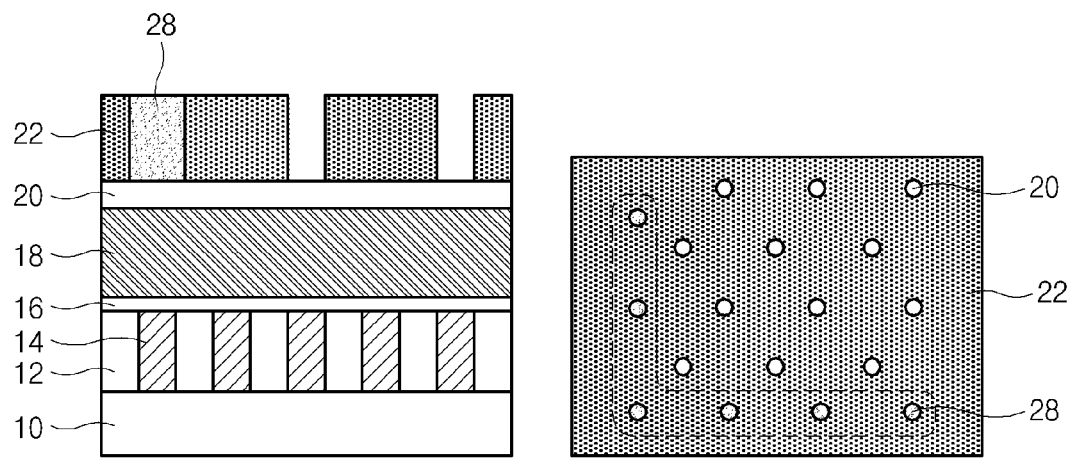
Figure 3H:
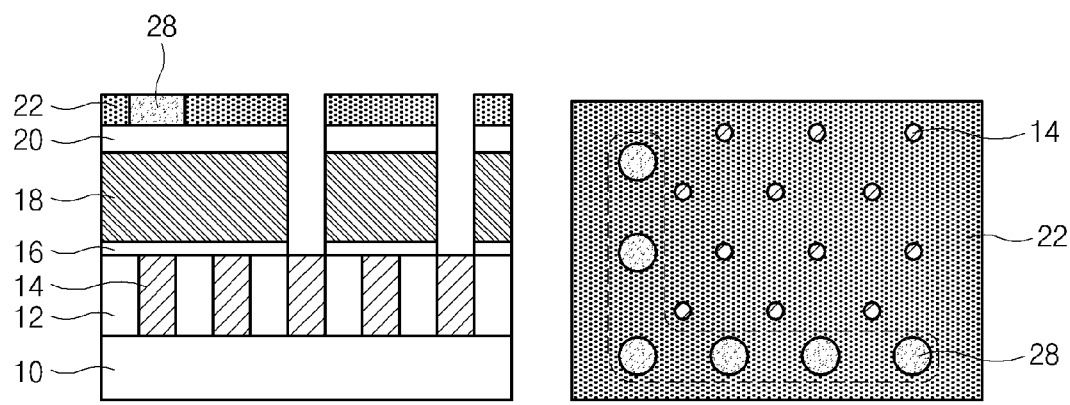

Referring to FIGS. 3g and 3h, the capping film 28 is blanket-etched to expose the pattern of the hard mask film 22. The capping film 28 that buries the first trench 30 is not removed by the blanket-etching process, but remains in place. Referring to FIG. 4g, the hard mask film 22, the PE-TEOS upper oxide film 26, and the capping film 28 are etched to a predetermined depth to remove the PE-TEOS upper oxide film 26.

The floating nitride film 20, the lower electrode oxide film 18, and the etching barrier film 16 are etched with the pattern of the hard mask film 22 including the residual capping film 28, thereby forming a lower electrode trench 50 that exposes the contact plug 14.

Since the first trench 30 in the lower portion of the dummy pattern is buried with the capping film 28, the lower electrode trench 50 is not formed by the dummy pattern.

Figure 3I:
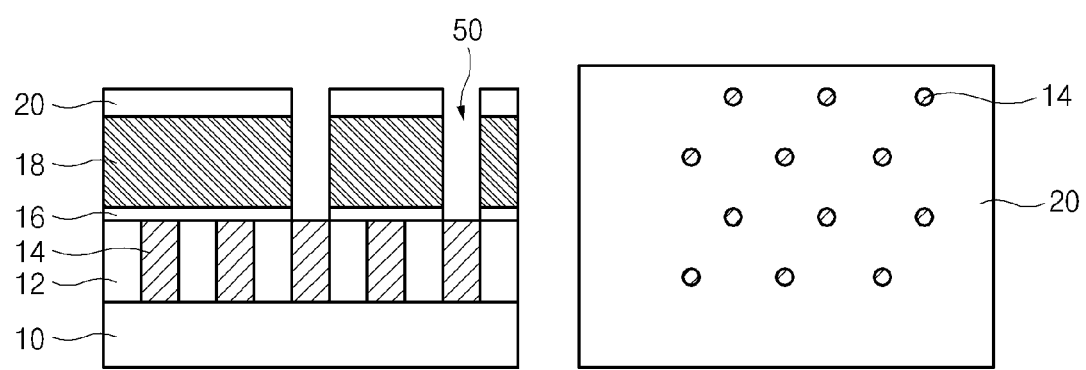

Referring to FIG. 3i, after the lower electrode trench 50 is formed, the pattern of the hard mask film 22 used as an etching mask is removed. Thereafter, a lower electrode, a dielectric material, and an upper electrode are formed by any suitable method, thereby obtaining a capacitor.

As described above, when a pattern of a lower electrode oxide film for forming a lower electrode of a cylinder type capacitor is formed, a method of fabricating a capacitor of a semiconductor device according to an embodiment of the invention can reduce a bunker defect that can be generated in a dip-out process and a short circuit phenomenon between a bit line and a lower electrode oxide film pattern that can be generated by a difference between hole sizes of a dummy pattern and a cell pattern. As a result, the method increases a process margin of the cylinder type capacitor to improve the reliability of the semiconductor device and reduce the manufacture development time.

The foregoing embodiments of the disclosure are illustrative and not limiting. Various alternatives and equivalents are possible. The invention is not limited by the type of deposition, etching polishing, and patterning steps describe herein, nor is the invention limited to any specific type of semiconductor device. For example, the disclosure can be implemented in a dynamic random access memory (DRAM) device or non volatile memory device. Other additions, subtractions, or modifications are intended to fall within the scope of the appended claims.

What is claimed is:

1. A method of fabricating a semiconductor device, the method comprising:
   sequentially forming an interlayer insulating film defining a contact plug, a lower electrode oxide film, and a hard mask film over a semiconductor substrate;
   etching the hard mask film with a mask comprising a dummy pattern and a cell pattern to form a hard mask pattern wherein a first trench is formed in a dummy pattern region and a second trench is formed in a cell pattern region;
   forming an upper oxide film over the hard mask pattern, wherein the upper oxide film exposes a first hole of the first trench and covers a second hole of the second trench;
   forming a capping film that buries the first trench and does not bury the second trench; and
   etching the lower electrode oxide film with the capping film and the hard mask pattern as a mask to form a lower electrode trench that exposes the contact plug.

2. The method of claim 1, wherein a diameter of the first hole is larger than a diameter of the second hole.

3. The method of claim 2, wherein the diameter of the first hole of the first trench in a range of about 10 nm to about 100 nm.

4. The method of claim 1, wherein the capping layer is formed over the upper oxide film.

5. The method of claim 1, wherein the upper oxide film is formed to have a thickness in a range of about 10 nm to about 1000 nm.

6. The method of claim 1, wherein the lower electrode oxide film comprises plasma enhancement-tetraethyloxysilicate (PE-TEOS).

7. The method of claim 1, further comprising forming an etching barrier film over the contact plug and a floating nitride film over the lower electrode oxide film.

8. The method of claim 7, wherein the floating nitride film comprises a low pressure nitride film formed by a chemical vapor deposition (CVD) method.

9. The method of claim 1, further comprising blanket-etching the capping film and exposing the hard mask pattern.

10. The method of claim 1, wherein the lower electrode oxide film comprises a film selected from the group consisting of phosphosilicate glass (PSG) oxide films, plasma enhancement-tetraethyloxysilicate (PE-TEOS) oxide films, and combinations thereof.

11. The method of claim 1, wherein the hard mask film comprises one selected from the group consisting of amorphous carbon layers, multi-functional hard mask films, and antireflection films.

12. A method of fabricating a capacitor of a semiconductor device, the method comprising:
sequentially forming an interlayer insulating film defining a contact plug, a lower electrode oxide film, and a hard mask film over a semiconductor substrate;
etching the hard mask film with a mask comprising a dummy pattern and a cell pattern to form a hard mask pattern wherein a first trench is formed in a dummy pattern region and a second trench is formed in a cell pattern region;
forming an upper oxide film over the hard mask pattern, wherein the upper oxide film exposes the first hole of the first trench and covers the second hole of the second trench;
forming a capping film that buries the first trench;
etching the lower electrode oxide film with the capping film and the hard mask pattern as a mask to form a lower electrode trench that exposes the contact plug; and
forming an lower electrode, a dielectric material, and an upper electrode.

13. The method of claim 12, wherein the first trench has a first hole and the second trench has a second hole, and a diameter of the first hole is larger than a diameter of the second hole.

14. The method of claim 12, wherein the capping layer is formed over the upper oxide film.

15. The method of claim 12, wherein the lower electrode oxide film comprises plasma enhancement-tetraethyloxysilicate (PE-TEOS).

16. The method of claim 12, further comprising forming an etching barrier film over the contact plug and a floating nitride film over the lower electrode oxide film.

17. The method of claim 16, wherein the floating nitride film comprises a low pressure nitride film formed by a chemical vapor deposition (CVD) method.

18. The method of claim 12, wherein the lower electrode oxide film comprises a film selected from the group consisting of phosphosilicate glass (PSG) oxide films, plasma enhancement-tetraethyloxysilicate (PE-TEOS) oxide films, and combinations thereof.

19. The method of claim 12, wherein the hard mask film comprises one selected from the group consisting of amorphous carbon layers, multi-functional hard mask films, and antireflection films.

* * * * *